(12) United States Patent
Youngner et al.

(10) Patent No.: US 8,067,991 B2
(45) Date of Patent: Nov. 29, 2011

(54) CHIP-SCALE ATOMIC CLOCK WITH TWO THERMAL ZONES

(75) Inventors: Daniel W. Youngner, Maple Grove, MN (US); Jeff A. Ridley, Shorewood, MN (US); Mary K. Salit, Plymouth, MN (US); Son T. Lu, Plymouth, MN (US); Linda J. Forner, Carver, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/891,441

(22) Filed: Sep. 27, 2010

(65) Prior Publication Data

US 2011/0187466 A1      Aug. 4, 2011

Related U.S. Application Data

(60) Provisional application No. 61/301,497, filed on Feb. 4, 2010.

(51) Int. Cl.
*H01S 1/06* (2006.01)
*H03B 17/00* (2006.01)

(52) U.S. Cl. ..................................... 331/94.1
(58) Field of Classification Search .............. 331/3, 94.1
See application file for complete search history.

(56) References Cited

U.S. PATENT DOCUMENTS

| | | | |
|---|---|---|---|
| 5,656,189 A | 8/1997 | Crockett et al. | |
| 6,570,459 B1 | 5/2003 | Nathanson et al. | |
| 6,927,636 B2 | 8/2005 | Deng et al. | |
| 2005/0062552 A1 | 3/2005 | Deng et al. | |
| 2006/0022761 A1 | 2/2006 | Abeles et al. | |
| 2007/0247241 A1 | 10/2007 | Braun et al. | |
| 2008/0225907 A1* | 9/2008 | Diels et al. | ................ 372/25 |

OTHER PUBLICATIONS

Youngner et al., "U.S. Appl. No. 12/873,441; Apparatus and Methods for Alkali Vapor Cells", Sep. 1, 2010.
Youngner et al., "U.S. Appl. No. 12/879,394; Fabrication Techniques to Enhance Pressure Uniformity in Anodically Bonded Vapo", Sep. 10, 2010.
Youngner et al., "U.S. Appl. No. 12/884,489; Designs and Processes for Thermally Stabilizing a Vertical Cavity Surface Emitt", Sep. 17, 2010.
Youngner et al., "U.S. Appl. No. 12/887,259; Design and Processes for Stabilizing a VCSEL in a Chip-Scale Atomic Clock", Sep. 21, 2010.

(Continued)

*Primary Examiner* — David Mis
(74) *Attorney, Agent, or Firm* — Fogg & Powers LLC

(57) ABSTRACT

A chip-scale atomic clock comprises a physics package and a laser die located in a first thermal zone of the physics package. A quarter wave plate is mounted in the physics package and is in optical communication with the laser die. A vapor cell is mounted in the physics package and is in optical communication with the quarter wave plate. The vapor cell is located in a second thermal zone that is independent from the first thermal zone. An optical detector is mounted in the physics package and is in optical communication with the vapor cell. The first thermal zone provides a first operation temperature at a first stability point associated with the laser die, and the second thermal zone provides a second operation temperature at a second stability point associated with the vapor cell.

20 Claims, 4 Drawing Sheets

OTHER PUBLICATIONS

Chung et al., "Spectral Characteristics of Vertical-Cavity Surface-Emitting Lasers With External Optical Feedback", "IEEE Photonics Technology Letters", Jul. 1991, pp. 597-599, vol. 3, No. 7, Publisher: IEEE.

Lutwak, et al., "The Chip-Scale Atomic Clock—Coherent Population Trapping vs. Conventional Interrogation", "34th Annual Precise Time and Time Interval (PTTI) Meeting", 2003, pp. 539-550, Publisher: Symmetricom—Technology Realization Center, Published in: Beverly, MA, USA.

* cited by examiner

CHIP-SCALE ATOMIC CLOCK WITH TWO THERMAL ZONES

CROSS-REFERENCE TO RELATED APPLICATION

This application claims the benefit of U.S. Provisional Patent Application Ser. No. 61/301,497, filed on Feb. 4, 2010, which is incorporated herein by reference.

BACKGROUND

Chip-Scale Atomic Clocks (CSACs) contain vapors of alkali metals, typically either rubidium (Rb) or cesium (Cs), which are located in vapor cells. The walls of the vapor cells are typically made from glass and silicon. A bichromatic (2 wavelength) optical field is sent through the vapor, exciting hyperfine transitions using a phenomenon called coherent population trapping. A rubidium-based CSAC, for example, works by exciting the D1 hyperfine transition using a vertical-cavity surface-emitting laser (VCSEL) that is tuned to the broad absorption at 795 nm and radio frequency (RF) modulated at 3.417 GHz—precisely half the D1 transition frequency.

It is known that some CSACs become inaccurate when the ambient temperature changes. This is due in part to the fact that two of the components in the CSAC, the vapor cell and the VCSEL, are not operated at their most stable temperatures.

One of the more challenging aspects of making CSACs for military applications involves dealing with the temperature variations that real military systems encounter during use. Even though attempts have been made to stabilize the temperature of the most sensitive components, the temperature sensitivity of the CSACs can still be a problem. For example, radiative coupling and gas-phase thermal conduction from the components inside the physics package to the walls of the package can cause the temperature of those components to change.

In order to minimize the temperature sensitivity in CSACs, both the vapor cell and the VCSEL need to be operated at points where $dF_{CSAC}/dT_{component}$ is zero. However, the temperature where $dF_{CSAC}/dT_{Rb-cell}$ is zero and the temperature at which the VCSEL outputs the proper wavelength of light is in general different. In attempting to thermally anchor these two components together as is traditionally done, maintaining CSAC stability over temperature can become a very big problem.

SUMMARY

A chip-scale atomic clock comprises a physics package and a laser die located in a first thermal zone of the physics package. A quarter wave plate is mounted in the physics package and is in optical communication with the laser die. A vapor cell is mounted in the physics package and is in optical communication with the quarter wave plate. The vapor cell is located in a second thermal zone that is independent from the first thermal zone. An optical detector is mounted in the physics package and is in optical communication with the vapor cell. The first thermal zone provides a first operation temperature at a first stability point associated with the laser die, and the second thermal zone provides a second operation temperature at a second stability point associated with the vapor cell.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A chip-scale atomic clock (CSAC) is provided that has a two-thermal zone configuration, including a first thermal zone for a laser die, such as a vertical-cavity surface-emitting laser (VCSEL), and a second thermal zone for a vapor cell, in the CSAC. The first thermal zone provides a first operation temperature at a first stability point associated with the laser die, and the second thermal zone provides a second operation temperature at a second stability point associated with the vapor cell.

The two-thermal zone configuration of the chip-scale atomic clock allows the vapor cell and laser die to be operated at their most stable operating points, independently of each other. The temperatures of the vapor cell and laser die are kept stable by using on-chip temperature sensors such as Wheatstone bridges, and off-chip control electronics.

As used herein, a "stability point" refers to a point in parameter space where a ratio of the change in frequency of the CSAC ($dF_{CSAC}$) to the change in temperature of a component in the CSAC ($dT_{component}$) is zero ($dF_{CSAC}/dT_{component}=0$). Such stability points exist for the two most temperature-sensitive components of the CSAC, the vapor cell and the laser die.

In some circumstances it may be preferable to operate the VCSEL at a temperature where $dF_{CSAC}/dPower_{vcsel}=0$. Here, $Power_{vcsel}$ is the RF power in the VCSEL beam. In general, the temperature where $dF_{CSAC}/dT_{vcsel}=0$ and the temperature where $dF_{CSAC}/dPower_{vcsel}=0$ will be different. In either case, it is necessary that there be independent thermal zones for the VCSEL and the vapor cell to optimize overall CSAC stability.

Figure 1:
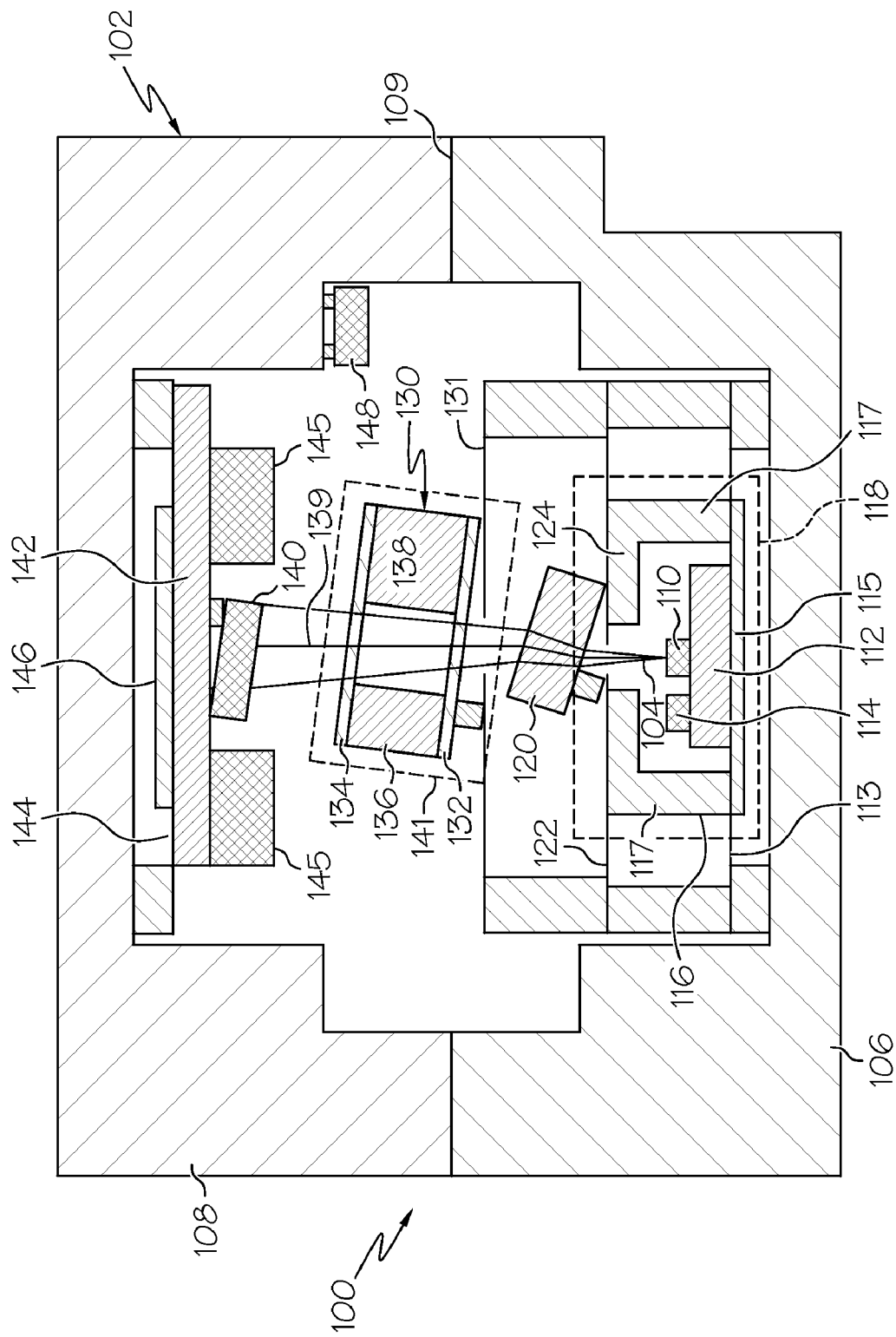
FIG. 1 is a cross-sectional schematic depiction of a physics package for a chip-scale atomic clock with a two-thermal zone configuration according to one embodiment.

FIG. 1 illustrates a CSAC 100 according to one embodiment, which has a two-thermal zone configuration. The CSAC 100 includes a physics package 102, which houses various mechanical and electronic components of CSAC 100. These components can be fabricated as wafer-level micro-electro-mechanical systems (MEMS) devices prior to assembly in physics package 102.

As shown in FIG. 1, the various components of CSAC 100 are assembled inside an upper device package 106 and a lower device package 108 of physics package 102. Suitable device packages for physics package 102 include 20-pin Leadless Chip Carriers (LCC-20) packages, and the like. Once the various components of CSAC 100 are assembled inside device packages 106 and 108, the device packages are sealed together at an interface 109 to form the completed CSAC.

In general, the CSAC components in package 102 include a laser die 110 such as a VCSEL, a quarter wave plate (QWP) 120 in optical communication with laser die 110, a vapor cell 130 in optical communication with QWP 120, and an optical detector 140 in optical communication with vapor cell 130. A laser beam 104 emitted from laser die 100 is directed to pass through QWP 120 and vapor cell 130 to optical detector 140. Further details of the CSAC components in package 102 are described hereafter.

As shown in FIG. 1, QWP 120, vapor cell 130, and optical detector 140 can be mounted within package 102 at various tilt angles with respect to the optical path of laser beam 104. Tilting these components reduces reflective coupling back into the VCSEL, further enhancing CSAC stability.

Further details related to tilting the components in a CSAC are described in copending U.S. application Ser. No. 12/887,259, filed on Sep. 21, 2010, and entitled DESIGN AND PROCESSES FOR STABILIZING A VCSEL IN A CHIP-SCALE ATOMIC CLOCK, the disclosure of which is incorporated herein by reference.

The laser die 110 is mounted on an upper surface of a controllable heater die 112, which in turn is mounted on a heater scaffold 113. Alternatively, heater die 112 can be integrated into scaffold 113, with laser die 110 mounted on scaffold 113. The heater die 112 is employed to keep laser die 110 always operating at its stability point. The scaffold 113 can be constructed with polyimide struts. A phototransistor 114 can also be mounted on the upper surface of heater die 112 and provides for controlling the output power of laser die 110. An underlying silicon layer 115 is located below heater die 112 on scaffold 113. The silicon layer 115 is part of a thermal path from heater die 112 up to QWP 120. This thermal path aids in surrounding laser die 110 with a constant-temperature environment regardless of the ambient temperature.

A Wheatstone bridge temperature sensor is located in heater die 112 and provides for improved thermal stability of laser die 110. In addition, a plurality of holes (not shown) in scaffold 113 are positioned at locations where solder connects scaffold 113 to heater die 112. The holes in scaffold 113 create a good thermal short to the underlying silicon layer 115, helping ensure a stable thermal environment around laser die 110.

An isothermal cage 116 surrounds laser die 110 to further stabilize the temperature of laser die 110. The isothermal cage 116 includes legs 117 that protrude downwardly from the bottom of a QWP scaffold 122. The legs 117 make thermal and mechanical contact with scaffold 113. The isothermal cage 116 aids in creating a first thermal zone 118 having a first operating temperature at a first stability point associated with laser die 110. In one embodiment, isothermal cage 116 is a MEMS thermal cage that is stabilized to within +/−0.004° C. as ambient varies from −40° C. to +65° C.

Further details related to fabricating a suitable thermal cage for use in the present CSAC are described in copending U.S. application Ser. No. 12/884,489, filed on Sep. 17, 2010, and entitled DESIGNS AND PROCESSES FOR THERMALLY STABILIZING A VERTICAL CAVITY SURFACE EMITTING LASER (VCSEL) IN A CHIP-SCALE ATOMIC CLOCK, the disclosure of which is incorporated herein by reference.

The QWP 120 can be mounted on scaffold 122, which is over scaffold 113, at a first tilt angle over an opening in isothermal cage 116. The QWP 120 can have a neutral density filter (NDF) thereon. An underlying silicon layer 124 is located below a central portion of QWP scaffold 122. The silicon layer 124 promotes thermal uniformity, and provides mechanical stability for the silicon legs 117 that protrude downwardly from the bottom of scaffold 122.

The vapor cell 130 can be mounted at a second tilt angle on a cell scaffold 131, which is over scaffold 122. The vapor cell 130 includes a pair of optically clear glass wafers 132 and 134 that are anodically bonded to opposing sides of a substrate 136 such as a silicon wafer. Exemplary glass wafers include Pyrex glass or similar glasses. At least one chamber 138 defined within vapor cell 130 provides an optical path 139 between laser die 110 and optical detector 140 for laser beam 104 emitted from laser die 110.

In one approach for fabricating vapor cell 130 prior to assembly within package 102, glass wafer 132 is initially bonded to a base side of substrate 136, after which rubidium or other alkali metal (either in liquid or solid form) is deposited into chamber 138. The glass wafer 134 is then bonded to the opposing side of silicon wafer 136 to form vapor cell 130. When a buffer gas is used, the manufacturing equipment containing the components for vapor cell 130 is evacuated, after which the buffer gas is backfilled into chamber 138. Thus, when the bonding is completed to seal vapor cell 130, the alkali metal and optional buffer gas are trapped within chamber 138.

A heater (not shown) is formed around vapor cell 130 during fabrication. The heater helps to keep vapor cell 130 always operating at its stability point, and aids in maintaining a second thermal zone 141 having a second operating temperature at a second stability point associated with vapor cell 130. A Wheatstone bridge temperature sensor is located in the heater and provides for improved thermal stability of vapor cell 130.

Further details related to fabricating a suitable vapor cell for use in the present CSAC are described in copending U.S. application Ser. No. 12/879,394, filed Sep. 10, 2010, and entitled FABRICATION TECHNIQUES TO ENHANCE PRESSURE UNIFORMITY IN ANODICALLY BONDED VAPOR CELLS, and in copending U.S. application Ser. No. 12/873,441, filed Sep. 1, 2010, and entitled APPARATUS AND METHODS FOR ALKALI VAPOR CELLS, the disclosures of both of which are incorporated herein by reference.

As shown in FIG. 1, the forgoing components associated with laser die 110, QWP 120, and vapor cell 130 are mounted in device package 106 of physics package 102. The optical detector 140 is mounted in device package 108 such that when device packages 106 and 108 are vacuum sealed together, optical detector 140 is in optical communication with vapor cell 130. The optical detector 140 can include a photodectector such as a photodiode, which converts an optical signal to an electrical signal.

The optical detector 140 can be mounted at a third tilt angle to a lower surface of an electronics heater 142, which in turn is mounted on an electronics scaffold 144 that is attached to an inner wall of device package 108. Various other discrete surface mounted components 145, such as amplifiers, capacitors, resistors, and the like, can also be attached to the lower surface of heater 142. An optional electronics heater die 146 is mounted to scaffold 144 on an opposing side from heater 142. A getter die 148 is affixed to another inner wall of device package 108 away from optical detector 140.

Figure 2:
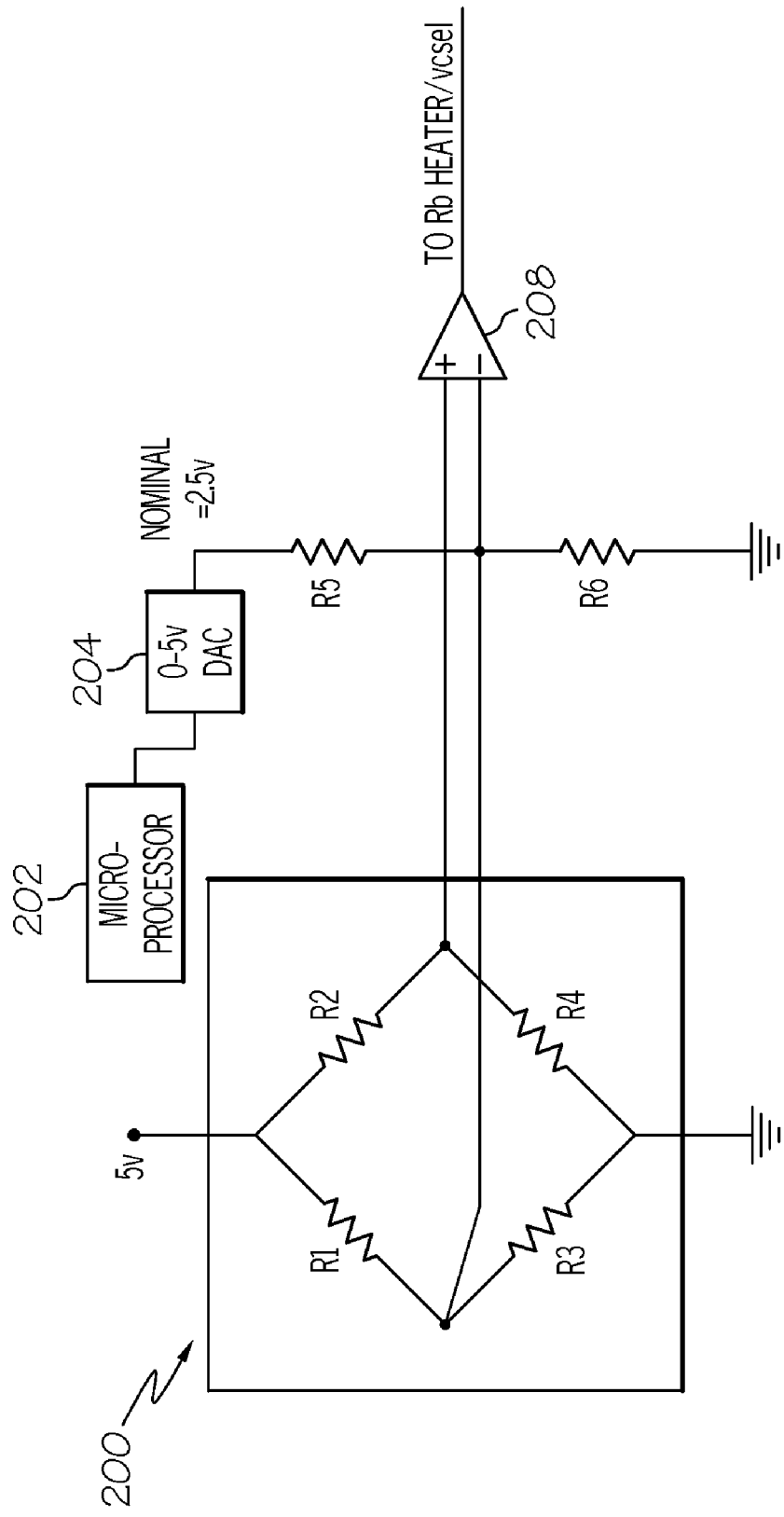
FIG. 2 depicts a Wheatstone bridge circuit that can be implemented in the chip-scale atomic clock of FIG. 1.

FIG. 2 depicts a Wheatstone bridge circuit 200 that can be implemented as a temperature sensor in the chip-scale atomic clock of FIG. 1. In one embodiment, the Wheatstone bridge is a set of four MEMS-fabricated temperature-sensitive resistors that are patterned directly on the device (e.g., Rb vapor cell, VCSEL heater, VCSEL scaffold), and that output a zero-volt signal only at one specific temperature. The Wheatstone bridge circuit 200 can be implemented with laser-trimmable resistors R1 and R4 such as NiCr resistors, and temperature-sensing resistors R2 and R3 such as platinum resistors. Optionally, the temperature-sensing resistors R2 and R3 can also be laser-trimmable.

A microprocessor 202 can be operatively coupled to Wheatstone bridge circuit 200 through a digital to analog converter (DAC) 204, which is connected to resistors R5 and R6. Positive and negative terminals of Wheatstone bridge circuit 200 are coupled to an amplifier 208, through which a signal is sent to the heater of the device.

Manufacturing Variability

The two-thermal zone configuration for the physics package described previously sets the operating temperature for the vapor cell and VCSEL at their respective stability points so that each becomes insensitive to thermal fluctuations. Moreover, the VCSEL can be operated at a temperature where the CSAC's output frequency is insensitive to fluctuations in the VCSEL's output power. By operating with two independent thermal zones in the physics package, it becomes possible to accept vapor cells from a large portion of each wafer after fabrication, and accept VCSELs with a broad range in their preferred operating temperatures. Accepting more die from each wafer causes production yields to go up and costs to come down. Such high-volume, low-cost manufacturing is provided by the two thermal-zone design, which is highly tolerant of manufacturing variances.

In general, the vapor cell and the VCSEL have acceptable process tolerances that are very tight. Even with the two-thermal-zone design it is desirable to tighten manufacturing tolerances as much as possible. A method for dealing with manufacturing variability in the vapor cells such as Rb cells is described as follows.

Initially, a buffer gas blend and the pressure inside anodic bonding equipment are controlled such that the temperature stability point of the Rb cells is about 110° C.+/−15° C. across each wafer during fabrication. In one exemplary approach, the buffer gas blend can be 42.2% nitrogen and 57.8% argon at a total pressure of 180 Torr. At the wafer level (e.g., with 609 Rb vapor cells on each wafer), the exact temperature of the stability point of each cell is measured and recorded to within about +/−2° C. Also at the wafer level, the Wheatstone bridge temperature sensors are trimmed on each Rb cell so that the bridge will be at its unique stability point.

After each physics package has been vacuum-packaged and is fully assembled, the temperature of the Rb cell is set such that $dF_{CSAC}/dT_{Rb-cell}$ is zero. This can be done under microprocessor control using the Wheatstone bridge circuit shown in FIG. 2. Once determined, all of the temperature set points are stored in on-board memory.

Thermal Modeling

Figure 3A:
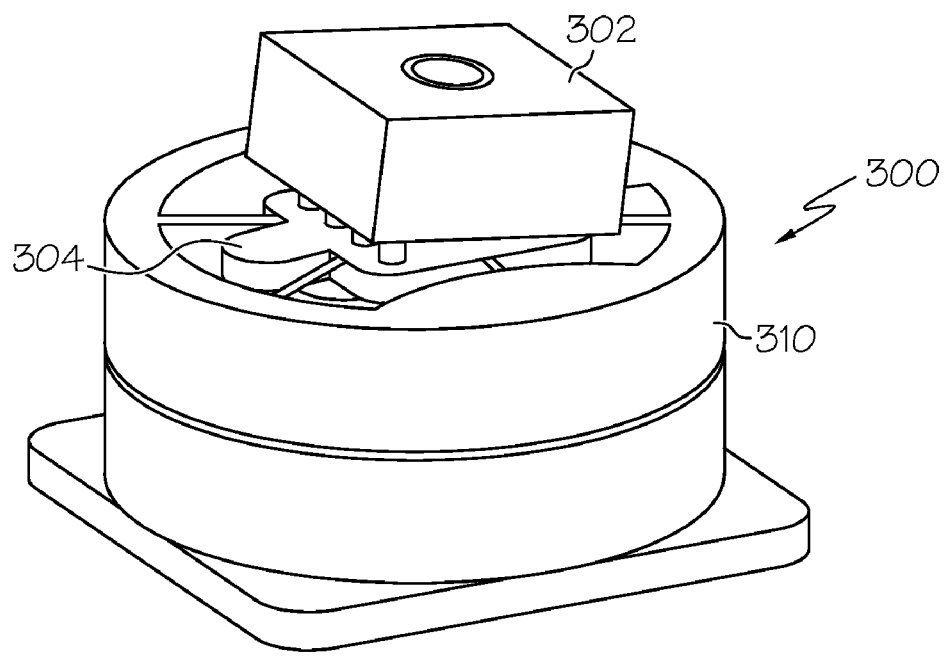
FIG. 3A is a schematic perspective view of a physics package for a chip-scale atomic clock used in thermal modeling.
Figure 3B:
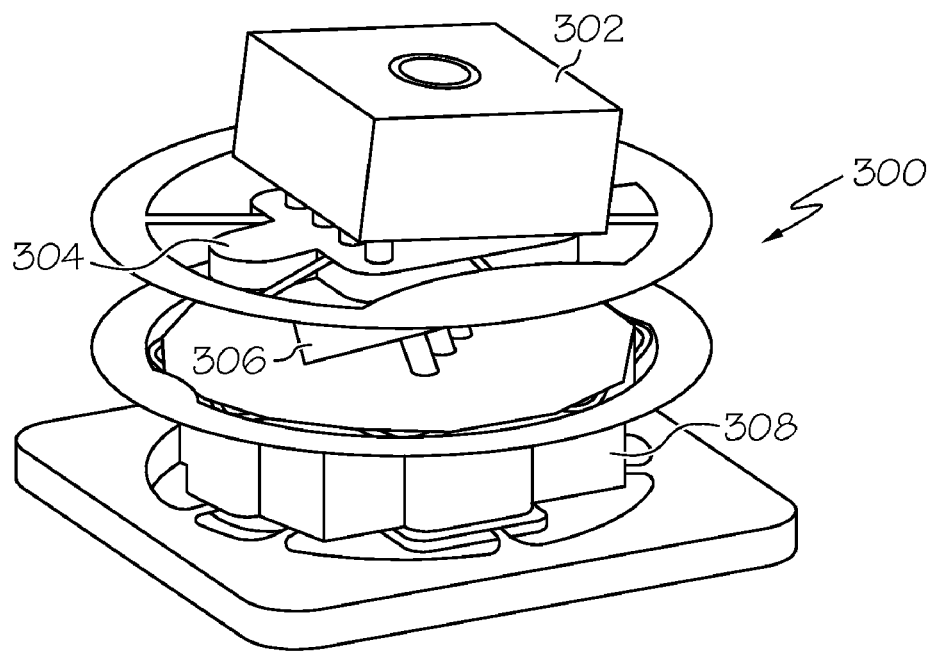
FIG. 3B is a schematic perspective view of the physics package of FIG. 3A, with the scaffold sidewalls removed, revealing internal structures of the physics package.

A thermal modeling simulation was run using Finite Element Modeling (FEM) images of a CSAC showing how heat is distributed through the various components of an assembled physics package, as well as the temperature profiles inside the physics package when the ambient temperature is −40° C. FIG. 3A is a schematic view of an assembled physics package 300 used in the thermal modeling. FIG. 3B shows physics package 300 with the scaffold sidewalls removed, revealing internal structures of physics package 300.

The physics package 300 includes a Rb cell 302 on a scaffold top 304, which is over a quarter wave plate 306, which in turn is over an isothermal cage 308 that surrounds a VCSEL (not shown). A scaffold 310 of physics package 300 includes polyimide struts, and patterned interconnect metal leads on the polyimide struts.

In the thermal modeling, the VCSEL and isothermal cage were set at 96.70° C. (the presumed operating temperature of the VCSEL in this simulation), and the Rb cell was set at 105.72° C. (its presumed stability point). The thermal impedance of the VCSEL and the thermal impedance of the Rb cell were optimized independently.

The thermal modeling took black-body radiation into account, as well as the thermal properties of all of the layers that go into making the various components of the CSAC. The background pressure in the physics package was assumed to be less than 1 mTorr so that the heat loss through gas-phase conduction would be comfortably below 1.4 mW. The thermal emissivity of the tops and sidewalls of the scaffolds was assumed to be 0.2.

Table 1 shows how much of the total heat loss is dissipated through black-body radiation (more than 5 mW), how much is conducted through the polyimide struts (nearly 2.4 mW), how much is lost through the patterned interconnect metal leads on the polyimide struts (less than 0.1 mW), and how much is lost through the gas-phase in the Rb cell (1.40 mW).

TABLE 1

| | Heat lost at −40° C. (mWatts) | | | |
|---|---|---|---|---|
| | Radiation | Metal Leads | Polyimide | Gas-phase |
| VCSEL | 0.2 | 0.05 | 0.96 | 0.89 |
| QWP | 1.4 | 0 | 0.89 | 0.11 |
| Rb Cell | 3.46 | 0.02 | 0.52 | 0.40 |
| Subtotals | 5.06 | 0.07 | 2.37 | 1.40 |
| Total | 8.9 mW | | | |

The present approach allows the CSAC power budget to stay below 10 mW. The power budget is a sensitive function of the thermal emissivity of the scaffolds in the CSAC. The power budget can be aided in staying below 10 mW by gold-coating the interior walls of the scaffolds to keep their thermal emissivity below 0.2, and installing getters to keep the pressure inside the physics package below 1 mTorr.

Figure 4:
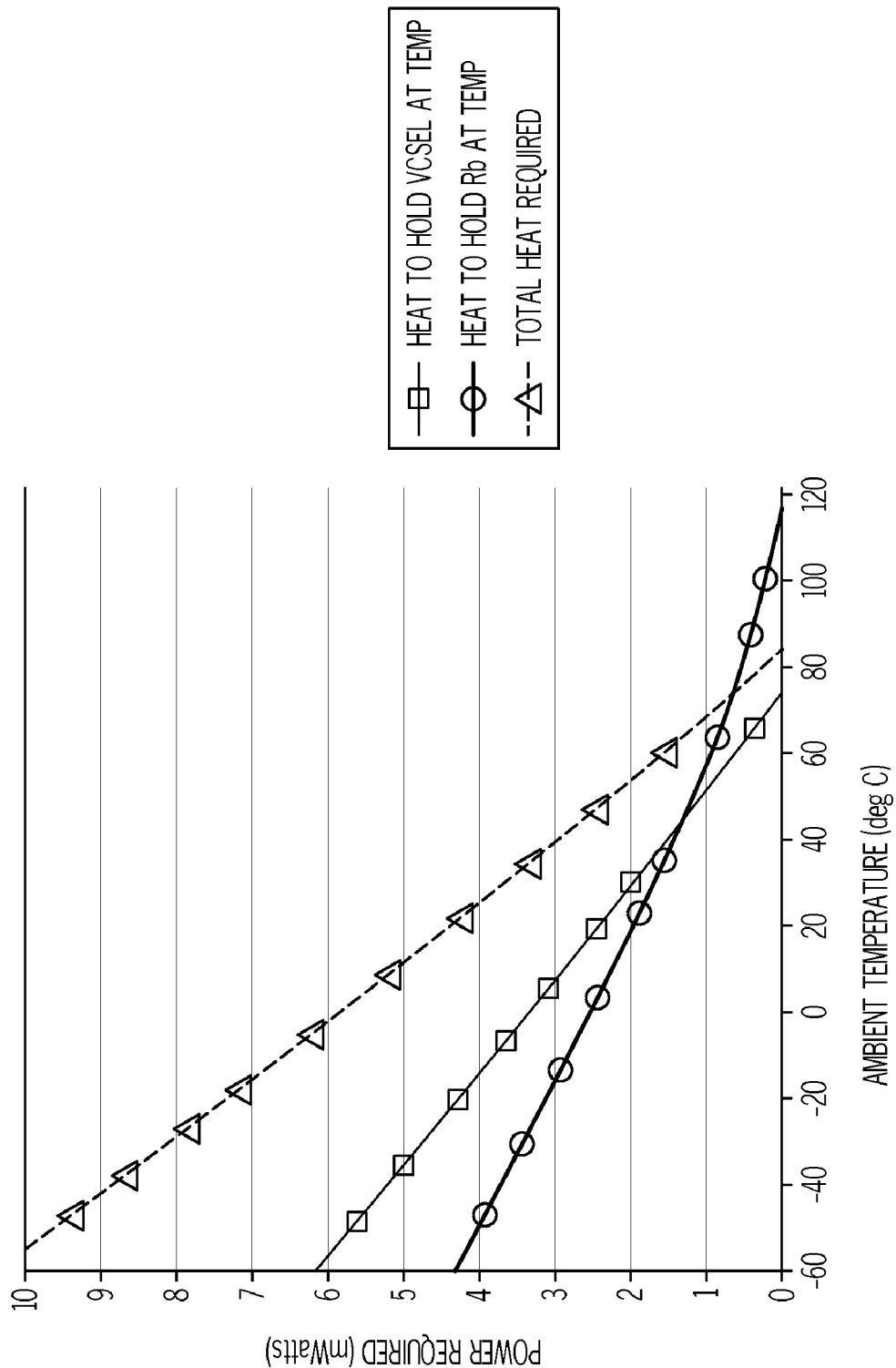
FIG. 4 is a graph showing the power required to hold the components of a physics package at their respective stability points, which is plotted as a function of ambient temperature.

In the graph of FIG. 4, the power required to hold the components of the physics package at their respective stability points is plotted as a function of ambient temperature. As shown in the graph, at −40° C. ambient, the total power required is 8.90 mW. Above 74.2° C. ambient, the power required to heat the VCSEL goes negative, indicating the upper temperature limit for the CSAC has been reached.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A chip-scale atomic clock, comprising:
   a physics package;
   a laser die located in a first thermal zone of the physics package;
   a quarter wave plate mounted in the physics package and in optical communication with the laser die;
   a vapor cell mounted in the physics package and in optical communication with the quarter wave plate, the vapor cell located in a second thermal zone that is independent from the first thermal zone; and an optical detector mounted in the physics package and in optical communication with the vapor cell;

wherein the first thermal zone provides a first operation temperature at a first stability point associated with the laser die, and the second thermal zone provides a second operation temperature at a second stability point associated with the vapor cell.

2. The chip-scale atomic clock of claim 1, wherein the laser die comprises a vertical-cavity surface-emitting laser.

3. The chip-scale atomic clock of claim 1, wherein the laser die is mounted on a heater die in the physics package.

4. The chip-scale atomic clock of claim 3, further comprising a phototransistor mounted on the heater die.

5. The chip-scale atomic clock of claim 3, further comprising a Wheatstone bridge temperature sensor in the heater die.

6. The chip-scale atomic clock of claim 3, wherein the heater die is mounted on a first scaffold in the physics package or integrated into the first scaffold in the physics package.

7. The chip-scale atomic clock of claim 3, further comprising an isothermal cage that surrounds the laser die and the heater die, the isothermal cage configured to maintain the first thermal zone at the first operation temperature.

8. The chip-scale atomic clock of claim 7, wherein the isothermal cage is temperature stabilized to within about +/−0.004° C. as ambient temperature varies from about −40° C. to about 65° C.

9. The chip-scale atomic clock of claim 1, wherein the quarter wave plate includes a neutral density filter.

10. The chip-scale atomic clock of claim 6, wherein the quarter wave plate is mounted on a second scaffold that is over the first scaffold in the physics package, and the vapor cell is mounted on a third scaffold that is over the second scaffold in the physics package.

11. The chip-scale atomic clock of claim 1, wherein the vapor cell includes a heater.

12. The chip-scale atomic clock of claim 11, further comprising a Wheatstone bridge temperature sensor coupled to the heater of the vapor cell.

13. The chip-scale atomic clock of claim 1, wherein the vapor cell contains rubidium or cesium.

14. The chip-scale atomic clock of claim 1, wherein the optical detector comprises a photodiode mounted to an electronics heater.

15. The chip-scale atomic clock of claim 1, further comprising at least one getter die in the physics package.

16. A chip-scale atomic clock, comprising:
a physics package;
a vertical-cavity surface-emitting laser (VCSEL) located in a first thermal zone of the physics package, the VCSEL configured to emit a laser beam along an optical path;
an isothermal cage surrounding the VCSEL in the first thermal zone;
a quarter wave plate in optical communication with the VCSEL and mounted in the physics package at a first tilt angle with respect to the optical path;
a rubidium vapor cell in optical communication with the quarter wave plate and mounted in the physics package at a second tilt angle with respect to the optical path, the vapor cell located in a second thermal zone that is independent from the first thermal zone; and
a photodetector in optical communication with the vapor cell and mounted in the physics package at a third tilt angle with respect to the optical path;
wherein the first thermal zone provides a first operation temperature at a first stability point associated with the VCSEL, and the second thermal zone provides a second operation temperature at a second stability point associated with the vapor cell.

17. A process of manufacturing a chip-scale atomic clock, the process comprising:
providing a physics package including an upper device package and a lower device package;
mounting a laser die in the lower device package;
forming an isothermal cage around the laser die, the isothermal cage configured to create a first thermal zone in the physics package that provides a first operation temperature at a first stability point associated with the laser die;
mounting a quarter wave plate over the laser die at a first tilt angle so that the quarter wave plate is in optical communication with the laser die;
mounting a vapor cell over the quarter wave plate at a second tilt angle so that the vapor cell is in optical communication with the quarter wave plate and located in a second thermal zone that is independent from the first thermal zone, the second thermal zone providing a second operation temperature at a second stability point associated with the vapor cell; and
mounting an optical detector in the upper device package at a third tilt angle so that the optical detector is in optical communication with the vapor cell when the upper device package and lower device package are vacuumed sealed together.

18. The method of claim 17, further comprising setting the operation temperature of the laser die such that a ratio of change in frequency of the chip-scale atomic clock to a change in temperature of the laser die is zero.

19. The method of claim 17, further comprising setting the operation temperature of the laser die such that a ratio of change in frequency of the chip-scale atomic clock to a change in the radio frequency power of the laser die is zero.

20. The method of claim 17, further comprising setting the operation temperature of the vapor cell such that a ratio of change in frequency of the chip-scale atomic clock to a change in temperature of the vapor cell is zero.

* * * * *